(12) United States Patent
Dister

(10) Patent No.: US 7,027,938 B1
(45) Date of Patent: Apr. 11, 2006

(54) PACKAGING FOR DYNAMOELECTRIC MACHINE DIAGNOSTIC SYSTEM

(75) Inventor: Carl J. Dister, North Olmsted, OH (US)

(73) Assignee: Reliance Electric Technologies, LLC, Mayfield Heights, OH (US)

( * ) Notice: Subject to any disclaimer, the term of this patent is extended or adjusted under 35 U.S.C. 154(b) by 564 days.

(21) Appl. No.: 09/164,206

(22) Filed: Sep. 30, 1998

Related U.S. Application Data

(63) Continuation-in-part of application No. 09/073,505, filed on May 6, 1998, now Pat. No. 6,041,287, which is a continuation-in-part of application No. 08/745,167, filed on Nov. 7, 1996, now Pat. No. 5,917,428, and a continuation-in-part of application No. 08/988,177, filed on Dec. 10, 1997, now abandoned.

(51) Int. Cl.
*H04M 11/04* (2006.01)

(52) U.S. Cl. ........................ 702/61; 702/188
(58) Field of Classification Search ............... D13/112, D13/114–116, 179; 702/182–188; 310/10; 361/688–697, 707, 710
See application file for complete search history.

(56) References Cited

U.S. PATENT DOCUMENTS

| | | | | | |
|---|---|---|---|---|---|
| 3,229,757 | A | * | 1/1966 | Root et al. ................. | 165/80.3 |
| 4,769,557 | A | * | 9/1988 | Houf et al. ................. | 307/147 |
| 4,840,222 | A | * | 6/1989 | Lakin et al. ................. | 165/47 |
| D360,879 | S | * | 8/1995 | Gronwall ................... | D13/162 |
| 5,563,570 | A | * | 10/1996 | Lee ........................... | 338/50 |
| 5,566,092 | A | * | 10/1996 | Wang et al. ................ | 702/185 |
| 5,763,969 | A | | 6/1998 | Metheny et al. | |
| 5,845,230 | A | * | 12/1998 | Lamberson ................. | 702/56 |
| 5,877,576 | A | * | 3/1999 | CoChimin .................. | 310/254 |
| 5,940,272 | A | * | 8/1999 | Emori et al. ................ | 361/704 |
| 6,011,331 | A | * | 1/2000 | Gierer et al. ................ | 310/58 |
| 6,260,004 | B1 | * | 7/2001 | Hays et al. ................. | 702/183 |

* cited by examiner

*Primary Examiner*—Marc S. Hoff
*Assistant Examiner*—Craig Steven Miller
(74) *Attorney, Agent, or Firm*—Amin & Turocy, LLP; Alexander M. Gerasimow

(57) ABSTRACT

A machine diagnostic system for on-line diagnosis of a machine including a package for a machine diagnostic module that collects data relating to operation of the machine. The package is mounted to an outer mounting surface of the machine and includes a container which contains the machine diagnostic module. The package further includes a heat dissipation device between the container and the outer mounting surface of the machine which dissipates heat generated by the machine into surrounding air thereby minimizing heat transfer to the container.

24 Claims, 4 Drawing Sheets

PACKAGING FOR DYNAMOELECTRIC MACHINE DIAGNOSTIC SYSTEM

RELATED APPLICATIONS

This application is a continuation-in-part of U.S. patent application Ser. No. 09/073,505 filed on May 6, 1998 entitled SYSTEM ARCHITECTURE FOR ON-LINE MACHINE DIAGNOSTICS now U.S. Pat. No. 6,041,287 which is a continuation-in-part of U.S. patent application Ser. No. 08/745,167 filed on Nov. 7, 1996 entitled INTEGRATED MOTOR AND DIAGNOSTIC APPARATUS AND METHOD OF OPERATING SAME now U.S. Pat. No. 5,917,428; and a continuation-in-part of U.S. patent application Ser. No. 08/988,177 filed on Dec. 10, 1997 entitled DYNAMOELECTRIC MACHINE DIAGNOSTIC MODULE now abn. These patent applications are assigned to the assignee of the present application and their entire disclosures are hereby incorporated by reference.

TECHNICAL FIELD

The present invention generally relates to packaging for a machine diagnostic system for on-line diagnosis of a dynamoelectric machine.

BACKGROUND OF THE INVENTION

Dynamoelectric machines such as motors and generators are widely employed in industrial and commercial facilities. These machines are relied upon for prolonged consistent operation, with only minimal attention. However, as with most machinery, at least a small percentage of such motors are prone to failure. The majority of the failures can be attributed to mechanical failures and/or thermal failures of the machine insulation. Other than normal aging, failures are typically due to poor maintenance, inappropriate insulation (e.g., wrong enclosure, excessive loading, etc.) and/or improper installation (e.g., misalignment, bad power, inverter mismatch, etc.). Moreover, even with normal aging failures, it is desirable to provide reliable failure prediction information for such machines.

The failure of a machine in service can lead to system down time, inconvenience, and possibly even hazardous conditions. Thus, it desirable to diagnose the machinery for possible failure or faults early in order to avoid such problems. Certain motor problems have an insidious effect in that although only a minor problem at the onset, they become serious if not detected. For example, insulation problems and electrical problems may not become apparent until irreversible damage is done. Likewise, bearing problems due to inadequate lubrication, contamination or other causes sometimes are only recognized after irreparable destruction has occurred.

Machine preventive maintenance is typically performed by coupling one or more portable recorders to a machine to collect data relevant to the machine's health, such as vibration data, motor flux data, motor current data and/or motor temperature data. Many such portable recorders experience problems with consistency in data recovery because of the inherent difficulty associated with placing the portable recorder in the exact same position as when the previous recording was taken. Since the creditableness of any trend analysis rests on the ability to reproduce the precise location of the data sensed so that accurate comparisons may be made, portable recorders are usually deficient in obtaining reliable data. Furthermore, because monitoring typically takes place at the machine, diagnosis may require significant manpower to collect the data.

Accordingly, the inventor appreciated that a need remains for an integrated dynamoelectric machine diagnostic system which measures vibration, current, temperature, voltage, shaft position and other parameters relating to the health of the machine. The inventor further appreciated that in such a diagnostic system, it would be preferable (if not necessary) for the component performing these measurements to be permanently mounted to the machine while at the same time being protected against environmental contamination and thermal damage.

SUMMARY OF THE INVENTION

The present invention provides an integrated dynamoelectric machine diagnostic system for measuring vibration, current, temperature, voltage, shaft position and other parameters relating to the health of the machine. A package according to the present invention allows the permanent mounting of a diagnostic module to the machine. In this manner, it is possible to perform machine preventive maintenance without having to couple a portable recorder to the machine to measure the relevant data. The package allows this permanent mounting by protecting the machine diagnostic module against environmental contamination and also against thermal damage from the heat generated by the machine.

More particularly, the present invention provides a machine diagnostic system for on-line diagnosis of a machine. In this system, a machine diagnostic module collects data relating to operation of the machine. A package for the machine diagnostic module comprises a container which contains the module and which is mounted to an outer mounting surface of the machine. The package further comprises a heat dissipation device between the container and the outer mounting surface of the machine. The heat dissipation device dissipates heat generated by the machine into surrounding air thereby minimizing heat transfer to the container.

The heat dissipation device preferably includes a first set of fins which transfer, by convention, the heat generated by the machine into the surrounding air. Each of the fins has a base which engages the outer mounting surface of the machine and a tip which engages the container. Heat is conducted through the base towards the tip and the heat is transferred, by convention, into the surrounding air during this conduction. The first set of fins are preferably attached to the container, more preferably integral with the container, and even more preferably formed in one piece with the container. The heat dissipation device may also include a second set of cooling fins having their bases attached to the container and their tips positioned in the passageway through which the airflow passes.

The container is formed by a series of walls preferably including a bottom wall and a set of side walls extending upwardly from the bottom wall to form a box-like structure. The fins project outwardly from one of the walls and, more preferably, project perpendicularly from the bottom wall. If the machine mounting surface is flat, the tip-to-base (or height) dimension of each of the fins is substantially the same. If the machine mounting surface is curved, the tip-to-base (or height) dimension of each of the fins will vary to form a contour corresponding to the curved machine mounting surface.

The dynamoelectric machine is preferably an electric motor including a rotor and a fan which generates an exhaust airflow. The exhaust airflow is directed, preferably by a shroud, towards the first set of fins so that the exhaust air may travel between at least some of the fins thereby conveying the surrounding air away from the container. If desired, a baffle arrangement may be provided that divides the fan exhaust airflow into a plurality of component airflows and directs the component airflows towards respective regions of the heat dissipation device.

One aspect of the invention relates to a dynamoelectric machine and a machine diagnostic system for on-line diagnosis of the machine in combination. The machine diagnostic system includes a machine diagnostic module which collects data relating to operation of the machine and a package which is mounted to an outer mounting surface of the machine. The package comprising a container which contains the machine diagnostic module and a heat dissipation device, positioned between the container and the outer mounting surface of the machine, which dissipates heat generated by the machine into surrounding air thereby minimizing heat transfer to the container.

Another aspect of the present invention relates to a package for a diagnostic module of a dynamoelectric machine. The package includes a container adapted to contain the diagnostic module; and a heat dissipation device which includes a first set of fins, at least one of the fins having a base which engages an outer mounting surface of the machine and a tip which engages the container whereby heat is conducted through the base towards the tip and is transferred by convection into the surrounding air.

Yet another aspect of the invention relates to a method for regulating temperature of a diagnostic module of a dynamoelectric machine, including the steps of: containing the diagnostic module within a container; and employing a plurality of fins to facilitate dissipating heat generated by the machine into surrounding air to minimize heat transfer to the diagnostic module, wherein at least one of the fins has a base which engages the outer mounting surface of the machine and a tip which engages the container whereby heat is conducted through the base towards the tip and is transferred by convection into the surrounding air.

These and other features of the invention are fully described and particularly pointed out in the claims. The following descriptive annexed drawings set forth in detail one illustrative embodiment, this embodiment being indicative of but one of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
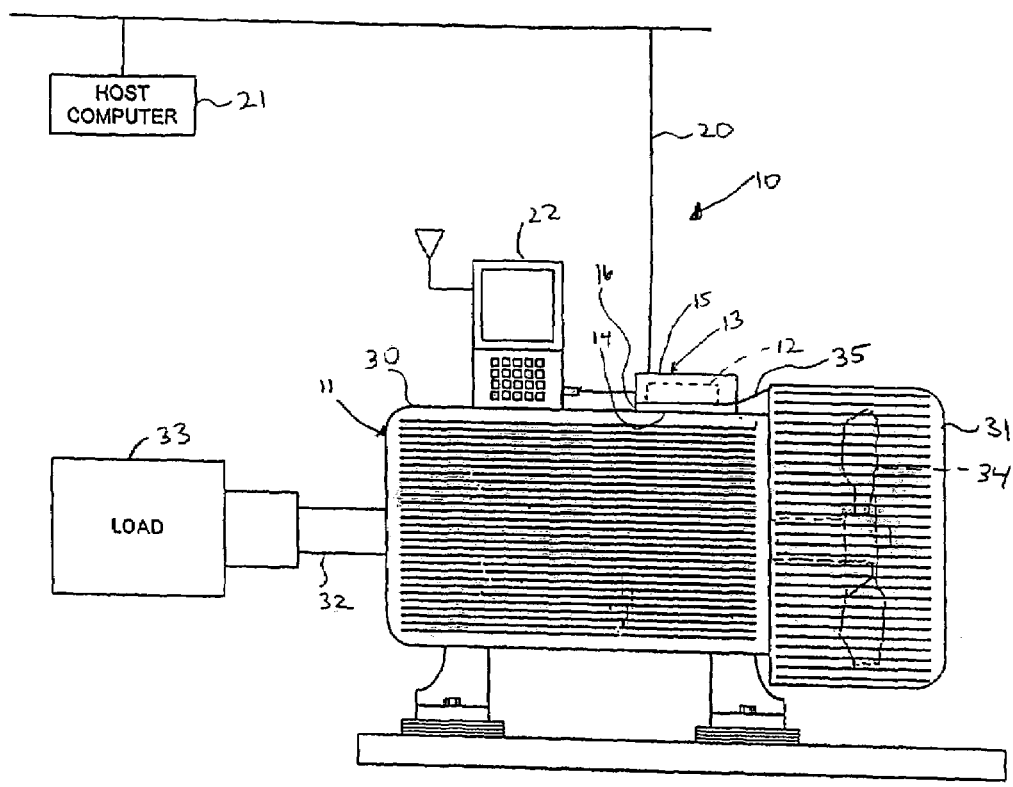
FIG. 1 is a schematic illustration of a dynamoelectric machine and a machine diagnostic system for on-line diagnosis of the machine, the system including a package for a machine diagnostic module mounted on a surface of the machine.

Referring now in detail to the drawings, and initially to FIG. 1, a machine diagnostic system 10 for on-line diagnosis of a machine 11 is schematically shown. The machine diagnostic system 10 includes a machine diagnostic module 12 which collects data relating to the operation of the machine 11 and a package 13 which is mounted to an outer mounting surface 14 of the machine 11. The package 13 comprises a container 15 which contains the machine diagnostic module 12 and a heat dissipation device 16 situated between the container 15 and the mounting surface 14 of the machine 11. The heat dissipation device 16 dissipates heat generated by the machine 11 into the surrounding air thereby minimizing heat transfer to the container 15 and thus the machine diagnostic module 12.

Figure 2A:
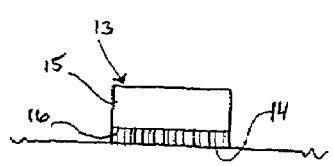
FIG. 2A is a schematic end view showing a flat mounting surface of the machine and the package, which includes a flat mounting surface, mounted thereon.
Figure 2B:
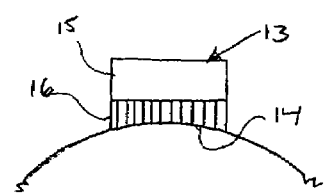
FIG. 2B is a schematic end view showing a curved mounting surface of the machine and the package, modified to include a corresponding curved mounting surface, mounted thereon.

The bottom surface of the package 13, and more particularly the bottom surface of the heat dissipation device 16, engages the mounting surface 14 of the machine 11. In the illustrated embodiment, the mounting surface 14 is flat whereby the bottom surface of the heat dissipation device 16 is also flat. (See FIG. 2A.) However, if the mounting surface 14 of the machine 11 was instead convexly curved as with, for instance, a cylindrical rotor housing, the bottom surface of the heat dissipation device 16 would be contoured in a corresponding manner. (See FIG. 2B.) As is explained in more detail below, the preferred heat dissipation device 16 includes a set of fins (namely fins 101–119 introduced below) and the height of these fins determines the geometry of the package's bottom surface.

Referring now back to FIG. 1, the machine diagnostic system 10 includes a plurality of sensors coupled to various parts of the motor 11. The sensors may include, for example, temperature sensors (e.g., thermocouples), motor voltage sensors, vibration sensors (e.g., accelerometers), encoders, and current sensors (coupled to the 3-phase power lines), lube sensors, flux sensors, acoustic sensors, brush sensors, and/or ultrasonic sensors for monitoring the operation of the motor 11.

The machine diagnosis system 10 also includes a network backbone 20 and a host computer 21. The network backbone 20 may be a hardwired data communication path made of twisted pair cable, shielded coaxial cable or fiber optic cable, for example, or may be wireless or partially wireless in nature. The host computer 21 is coupled to the network backbone 20 to allow on-line diagnosis of the machine 10. More specifically, data will be collected from the machine 10 and partially processed by a diagnostic module 12 so as to produce diagnostic data. The diagnostic data is provided to the host computer 21 for analysis to render a health assessment of the machine 10. The machine diagnosis system 10 may also perform trend analysis on the machine 10 and, if so, the system 10 may display the diagnostic data and/or trends in a variety of formats so that health assessment and trend information may be efficiently interpreted.

The machine diagnosis system 10 may further include an interfacing unit 22 that interfaces with the diagnostic module 12 and/or the host computer 21. In the illustrated embodiment, the interfacing unit 22 is shown mounted to the machine 11. However, the interfacing unit may be located remote from the machine 11. Furthermore, in some diagnosis systems, the diagnostic module 12 may be adapted to carry out all of the functions of the interfacing unit 22 and even the host computer 21.

In the illustrated embodiment, the machine 11 is a three-phase AC induction motor that is AC powered. However, the machine diagnostic system 10 may be applied to an entire range of motors, such as induction motors, DC motors, DC synchronous motors, AC synchronous motors, motors driven via inverters, motors driven via SCR soft starts and combinations thereof. Moreover, the machine diagnostic system 10 may be used with most other electric and/or rotating machines such as pumps, generators, gear boxes. That being said, the terms "machine" and "motor" are used interchangeably in the rest of the detailed description since a motor is the illustrated form of the machine 10.

The illustrated motor 11 includes a rotor section 30 and a fan section 31. The rotor section 30 houses a rotor connected to a shaft 32 having an output end which is depicted driving a load 33. The load 33 is any assembly, mechanism or article typically driven by a motor such as, for example, a pump. In the illustrated embodiment, the rotor section 30 includes the mounting surface 14 for the package 13. The mounting surface 14 is located at the top of the machine 11 whereby the package 13 is mounted on the top of the machine 11 in an upright orientation. However, other package mounting arrangements and orientations are possible with, and contemplated by, the present invention.

The fan section 31 houses a fan 34 that is driven by the opposite end of the shaft 32 and the fan generates an exhaust airflow. The motor 11 further includes a fan shroud 35 which is adapted to form a passageway for the exhaust airflow between the fan section 31 and the package 13 for the machine diagnostic module 12. In this manner, substantially all of the exhaust air from the fan 34 will be directed to the package 13, and more particularly directed through the heat dissipation device 16, to minimize heat transfer from the motor 10 to the container 15, as is explained in more detail below.

Figure 5:
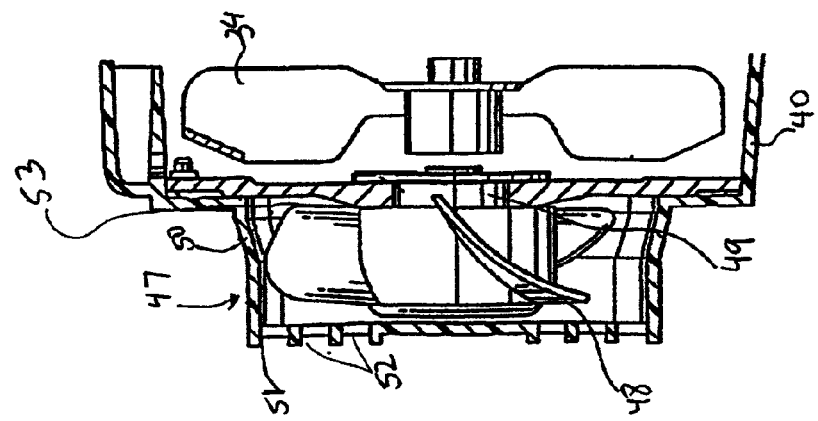
FIG. 5 is a side, partly in section, more detailed view of yet another possible design for the fan section of the machine.
Figure 4:
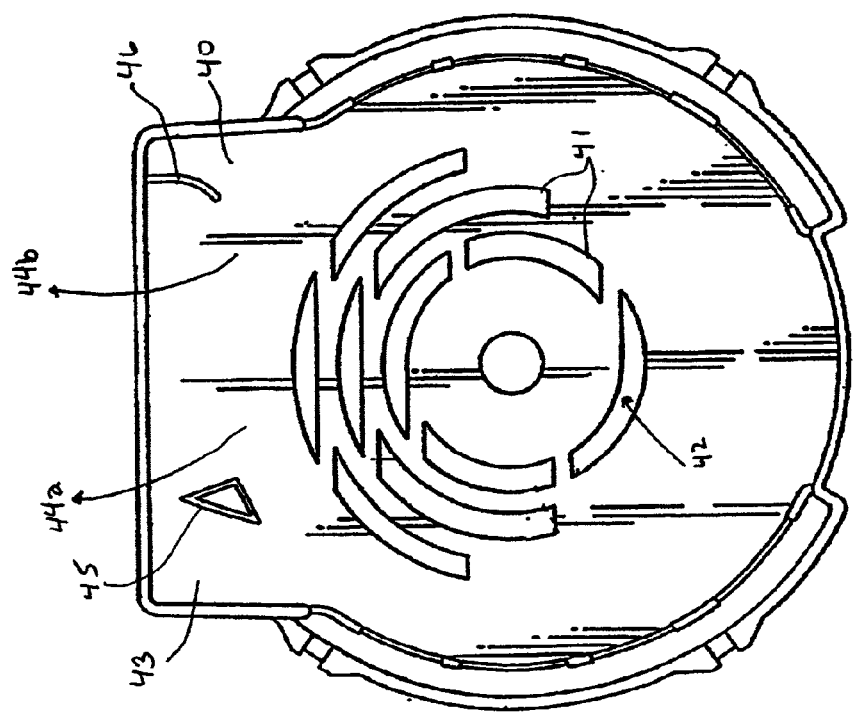
FIG. 4 is an end more detailed view of another possible design for the fan section of the machine.
Figure 3:
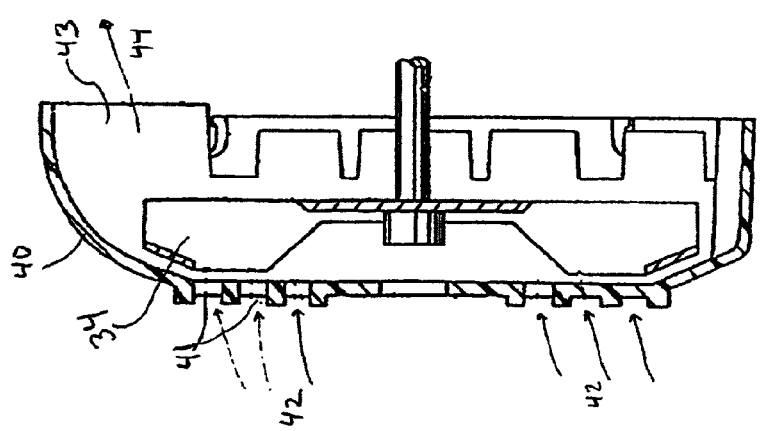
FIG. 3 is a side, partly in section, more detailed view of one possible design for a fan section of the machine.

Referring now to FIGS. 3–5, they show various designs for the fan section 31 of the motor 11. In FIG. 3, the fan shroud 35 includes a face plate 40 with a plurality of inlet apertures 41. The inlet air is drawn by rotation of the fan 34 through the inlet apertures 41 into the cavity formed by the fan shroud (FIG. 1) as is generally designated by arrows 42. The air is then exhausted through an air exhaust passageway 43 formed by the fan shroud 35. The exhaust airflow is directed in a common path generally designated by arrow 44.

In FIG. 4, the exhaust air is divided into a pair of component exhaust airflows 44a and 44b. (Each of the component airflows 44a and 44b are directed "into" the page as viewed in FIG. 4. In other words, they travel in the same direction as the airflow 44 shown in FIG. 3.) The first component exhaust airflow 44a is directed to a first region of the heat dissipation device 16 and the second component exhaust airflow 44b is directed to a second region of the heat dissipation device 16 (namely regions 140 and 141, respectively, introduced below). Preferably each of the component airflows 44a and 44b has a unique volume airflow rate that is selected to provide adequate cooling. In the illustrated embodiment, the component exhaust airflows 44a and 44b are generated by baffles 45 and 46 mounted to the face plate 40. Further details of these baffles 45 and 46 and the airflow patterns they create are set forth in U.S. Pat. No. 5,763,969, the entire disclosure of which is hereby incorporated by reference.

In FIG. 5, the fan section 31 includes an auxiliary blower unit 47 including an auxiliary fan 48 driven by a motor 49. The motor 49 is preferably a variable speed DC motor, so that its speed may be varied in a manner corresponding to the operating speed of the motor 11. However, other auxiliary motors may be used instead, such as a simple single phase fixed speed AC or DC motor. If a fixed speed motor is used, a speed is selected to generate an airflow providing optimized cooling effect over the entire range of operating speeds of the motor 11. In any event, the auxiliary blower unit 47 includes a fan shroud 50 with a face plate 51 having a plurality of air inlet apertures 52 and an open outlet side 53 which interfaces with the fan shroud 35. Inlet airflow 42 is drawn into the auxiliary shroud 50 through the apertures 52, into the main fan shroud 35, and through the exhaust passageway 43.

Figure 6:
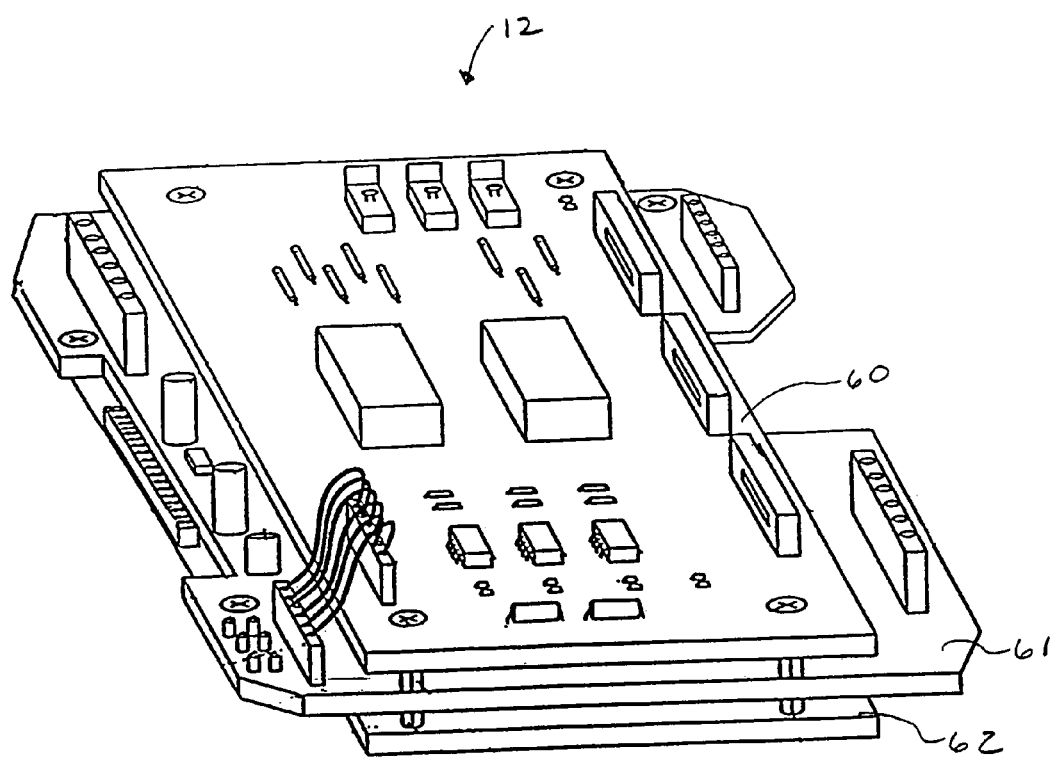
FIG. 6 is schematic close-up perspective the machine diagnostic module and the package.

The machine diagnostic module 12 is schematically shown in FIG. 6. The illustrated diagnostic module 12 comprises a stacked arrangement of circuit boards, namely a power board 60, an analog to digital (A/D) converter board 61, and a processor/memory board 62, secured together in their corners. The power board 60 includes contacts for receiving 3-phase input power from the power lead wires to supply power to the motor, current sensors, a resistive divider network, step down transformers, a signal conditioning system, and a signal connector. The A/D converter board 61 includes ports for receiving analog signals from various sensors and converts these signals into digital form in order to facilitate processing thereof. The processor/memory board 62 provides for the interface between the diagnostic module 12 and other components of the system 10.

It may be noted that the number, arrangement, or functioning of the circuit boards 60–62 may not be important to an understanding of the present invention. Also, other designs of diagnostic modules are certainly possible with, and contemplated by, the present invention. Nevertheless, this brief description of a typical machine diagnostic module is provided to underscore the significance of the package 13 and its importance in the diagnostic system 10.

Figure 7:
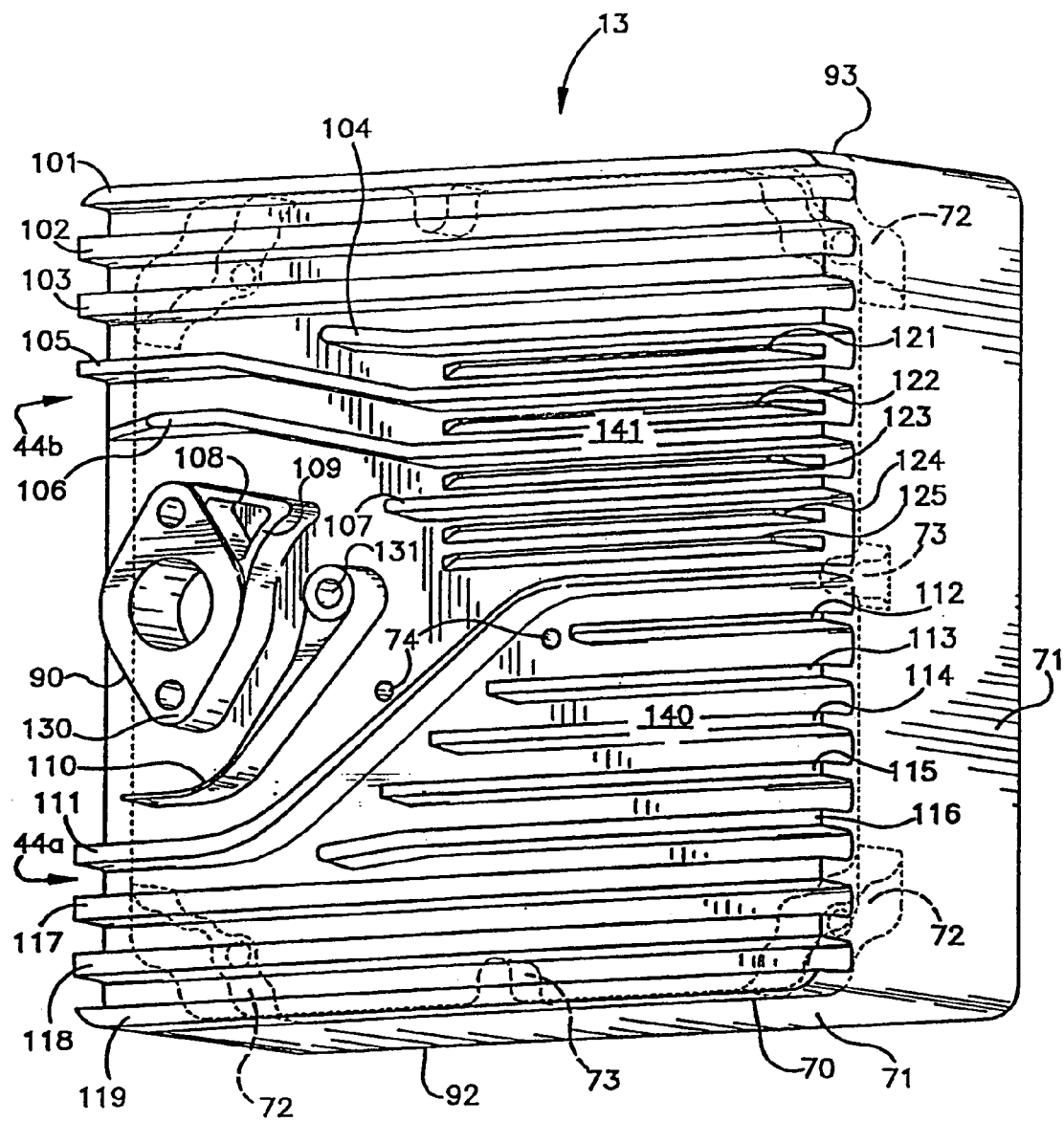
FIG. 7 is a detailed perspective view of the package in an inverted orientation.

Referring now to FIG. 7, the package 13 allows permanent mounting of the diagnostic module 12 to the motor 11. (In the context of the present application, the term "permanent" refers to something which, in contrast to the portable recorders used in the past, is intended to remain mounted on the machine 11 for prolonged periods of time, but which could be removed if for some reason desired.) In this manner, vibration data, motor flux data, motor current data, motor temperature data, and other relevant data may be reliably collected at the appropriate times at the same precise location whereby accurate comparisons may be made. In any event, the package 13 allows this permanent mounting by protecting the machine diagnostic module 12 against environmental damage (such as dust and debris) and also thermal damage from the heat generated by the machine 11.

The container 15 (FIG. 1) of the package 13 includes a bottom wall 70 and four side walls 71 which extend perpendicularly upward from the bottom wall 70. The walls 70 and 71 form a rectangular (and almost square) enclosure for the module 12. The corners of the bottom wall 70 and the exterior corners adjoining the side walls 71 are slightly rounded to eliminate any sharp intersections. Although not shown in the drawings, the container 15 may also include a cover wall, which is preferably selectively removable for inspection of the module 12. For example, corners of the container 15 could be constructed to include threaded openings and a rectangular plate-like member cover could be secured, by screws, to the corners of the container 15. Also, as a matter of additional caution, the container 15 may be coated with thermal insulation so as to further segregate the diagnostic module 12 from heat generated by the motor 11.

The interior of the container 15 is adapted to accommodate mounting of the diagnostic module 12 therein. For example, the interior bottom corners of the container 15 may include corner posts 72 adapted to receive the ends of the screws. The container 15 may also include pedestals 73 positioned centrally on three of the four side walls 71 to support the circuit boards 60–62 in a slightly elevated manner. Additionally, apertures 74 may be provided to accommodate the inlet of circuit lines (such as sensor lines, for example) into the container 15 for connection with the module 12.

Openings are also provided in the bottom wall 70 which align with the openings in certain components of the heat dissipation device 16, namely boss members 131 and 132 introduced below.

Preferably, the container 15 is made of the same material as the heat dissipation device 16. More preferably, the container 15 is integral with the heat dissipation device 16 and more preferably, the container 15 is formed in one piece with the heat dissipation device 16. Accordingly, the material selected for the container 15 should be structurally strong enough to protect the diagnostic module 12 from physical damage while at the same time satisfying the heat transfer requirements of the heat dissipation device 16 that are discussed in more detail below. For example, the material for the container 15 may include at least one of the following materials: cast iron, dicast aluminum, extruded aluminum, machined aluminum, and thermally conductive plastic. Of course, it is to be appreciated that any material suitable for carrying out the present invention may be employed and the use of such is intended to fall within the scope of the hereto appended claims.

The heat dissipation device 16 is situated between the bottom wall 70 of the container 15 and the outer mounting surface 14 of the machine 11. The heat dissipation device 16 is specifically designed to dissipate the heat generated by the machine 11 into surrounding air thereby minimizing heat transfer to the container 15. In the preferred embodiment of the invention, this heat dissipation is accomplished or at least aided by the fan exhaust airflow passing through the heat dissipation device 16 in an upstream-downstream direction. Accordingly, the heat dissipation device 16 may be viewed as having a front edge 90 which is its upstream edge, a rear edge 91 which is its downstream edge, and two lateral edges 92 and 93 on either sides thereof. (In the inverted orientation shown in FIG. 7, the lateral edge 92 is on the left side and the lateral edge 93 is on the right side.) The front, rear and lateral edges 90–93 of the heat dissipation device 16 corresponds to the front, rear and lateral edges of the package 13 and/or the container 15.

The heat dissipation device 16 includes a first set of fins 101–119, a second set of fins 121–125, a boss member 130, and another boss member 131.

The fins 101–119 are all generally ribbon-shaped or strip-shaped, that is they each have a width dimension substantially less than its height dimension, and a length dimension substantially greater than its width dimension and/or height dimension. Also, one of the ends of each of the fins 101–119 is attached to the bottom wall 70 of the container 15 and extends perpendicularly therefrom. (In other words, the fin height dimension is measured in a direction perpendicular to the container's bottom wall 70.)

Fins 101–103, extend longitudinally from the front edge 90 to the rear edge 91. Except for the longitudinal ends of the fin 101 which are rounded to match the contour of the rounded corners of the container 15, the fins 101–103 are each generally straight linear fins. The width of the fins 101–103 increases slightly from fin 101 to fin 103. Fin 104 extends from the rear edge 91 approximately two-thirds the distance to the front edge 90 and has a front section that bends slightly outward (towards fin 103). The width of the fin 104 is slightly less than the width of fin 101.

Fin 105 extends longitudinally from the front edge 90 to the rear edge 91. The fin follows a relatively straight path, then bends slightly inward (towards fin 106) about one-fourth of the distance downstream, and then straightens back about half of the distance downstream. The width of the fin 105 is slightly less than the width of fin 104. Fin 106 follows the same general bend pattern as fin 105 and has an upstream edge that is sloped downward towards the container bottom wall 70. The width of fin 106 is slightly less than the width of fin 105. Fin 107 extends longitudinally from the rear edge 91 to approximately just over half the upstream-downstream distance and is slightly less wide than fin 106.

Fins 108–110 are positioned within this trapezoidal area defined by the front sections of fins 106 and 111, and the boss members 130 and 131 are also positioned within this trapezoidal area. Specifically, fins 108 and 109 extend downstream from respective ends of one wall of the boss 130 (specifically its rear side closest to fin 106) and towards each other so that they meet at a rounded corner to form a delta shape. The fins 108 and 109 are the same width, this width being slightly less than the width of fin 107. The fin 110 is a generally comma-shaped fin that extends outward (towards fin 111) from the boss 131 and that has a width dimension gradually decreasing towards its tail end.

The fin 111 extends from the front edge 90 to the rear edge 91 in a serpentine-like path. More particularly, it extends straight inward from the front edge 90 about one-eighth the front-rear distance, bends inward (towards fin 107), and then straightens back out about five-eights of the front-rear distance. The width of the fin 111 is slightly less than the width of fin 107.

The fin 111 and the fin 117 form therebetween a "half-of-a-house" shaped region in which the fins 112–116 are located. The fins 112–116 extend from the rear edge 91, increase sequentially in length, increase sequentially in width, and have a straight profile except for fin 116 having a slight bend outward (towards fin 117) at its upstream edge. The remaining fins 117–119 form a symmetrical version of the fins 101–103.

The height of the fins 101–119 is such that they will all engage the mounting surface 14 of the machine 11, except for the upstream end of fin 106. (As was explained above, the bottom surface of the heat dissipation device 16 engages the mounting surface 14 of the machine 11.) The package 13 illustrated in FIG. 7 is designed for use on the flat mounting surface 14 of the machine 10 whereby all of the fins 101–119 are of the same height. (See FIG. 2A.) However, if the mounting surface 14 of the machine 11 was instead convexly curved, the height of the fins 101–119 would gradually decrease towards its lateral center and then increase to correspond to the convexity of the mounting surface 14. (See FIG. 2B.)

In many heat-transfer situations, a fin is integrally attached to the heat-generating object so that it may transfer the heat therefrom. The base of the fin is attached to the heat-generating object and the tip of the fin is suspended in the surrounding air. In such a situation, the fin material preferably has a low thermal conduction coefficient to minimize temperature variations from its base to its tip. In other words, the temperature differential between the tip of the fin and the base of the fin is preferably as low as possible. The fin material preferably also has a high thermal convection coefficient to maximize heat dissipation to the surrounding air.

In the present invention, the heat transfer objectives are somewhat opposite from a traditional fin heat-transfer situation. As indicated above, the fins 101–119 are attached to the container 15 (and preferably are formed in one piece therewith), but the container 15 is not the heat-generating object. Instead, for heat transfer purposes, the container-attached longitudinal edges of the fins 101–119 are considered the tips of the fins and the motor-engaging longitudinal edges of the fins 101–119 are considered the bases for the fins. For this reason, in contrast to conventional fins, it is undesirable for the fin material to have a low thermal conduction coefficient. A high thermal conduction coefficient is instead preferred to maximize temperature variations from its base to its tip. In other words, the temperature differential between the tip of the fin and the base of the fin is preferably as high as possible. It is still, however, desirable for the fin material to have a high thermal convection coefficient to maximize heat dissipation into the surrounding air.

When the package 13 is mounted on the machine, a series of passageways are formed by the mounting surface 14 of the machine 10, the bottom wall 70 of the container 15, and the lateral sides of the first set of fins 101–119. If a single common exhaust airflow fan design is used (see e.g., FIG. 3), the exhaust air will travel through each of these passageways in a substantially uniform manner. If a baffle arrangement is used to divide the exhaust air into component airflows, these will be directed to appropriate regions of the heat dissipation device 16. For example, in the baffle arrangement shown in FIG. 4, the component airflows 44a and 44b will be directed into a first region 140 and a second region 141, respectively. The inlet of the first region 140 is defined by the front sections of the fins 111 and 117 and opens into the "half-a-house" shaped area in which the fins 113–116 are situated. The second region 141 is defined by fins 105 and 106.

During operation of the motor 11, heat from its mounting surface 14 will be transferred to the first set of fins 101–119. Due to the relatively large surface area of the fins' lateral sides (i.e., defined by the fins' height and length dimensions), a substantial amount of heat will be transferred, by convection, to the surrounding air. Preferably, the "heated" surrounding air will be immediately conveyed away by the fan exhaust airflow thereby keeping the temperature of the surrounding air at a minimum to encourage maximum convective heat transfer. Because the fin material has a low thermal conductivity, the tip of each of the fins attached to the container 15 should be at a significantly lower temperature than the base of the respective fin contacting the motor mounting surface 14.

The second set of fins 121–125 are also all generally ribbon-shaped or strip-shaped, that is they each have a width dimension substantially less than its height dimension, and a length dimension substantially greater than its width dimension and/or height dimension. Also, one of the ends of each of the fins 121–125 is attached to the bottom wall 70 of the container 15 and extends perpendicularly therefrom.

The fins 121–125 are all of substantially the same width (about half the width of the narrowest fin in the first set of fins 101–119). The fins 121–125 are all also of substantially the same length which is approximately half the upstream-downstream distance and they all terminate at the rear edge 91. Relative to the first set of fins 101–119, fin 121 is positioned between fins 104 and 105, fin 122 is positioned between fins 105 and 106, fin 123 is positioned between fins 106 and 107, and fins 124 and 125 are positioned between fins 107 and 111.

Significantly, the second set of fins 121–125 are of a lesser height than the first set of fins 101–119. Accordingly, their distal longitudinal edges (i.e., the edges opposite the container-attached longitudinal edges) do not contact the motor mounting surface 14. As such, the second set of fins 121–125 function as traditional fins in that they transfer heat absorbed by the container 15 to the surrounding air. Accordingly, the fins 121–125 may be viewed as conventional cooling fins.

As indicated above, the boss members 130 and 131 are positioned in the roughly trapezoidal area between the front sections of the fins 106 and 111. The boss member 131 has an elongated oval shape, or more particularly a four-sided marquise diamond shape softened with round corners. It is positioned adjacent the front edge 90 and its minor axis is situated perpendicular thereto whereby the diamond sides are slanted relative to the front edge 90. In any event, the boss 131 defines a channel for the lead, sensor, and power wires between the motor 11 and the module 12. (As was explained above, the bottom wall includes openings aligned with these channels so that such wires may pass through to the interior of the container 15.) The exposed end surface of the boss 131 (i.e., the surface opposite the bottom wall 70) is smooth for engagement of a gasket to seal the channel.

The boss member 131 has a generally annular shape with a cylindrical housing surrounding an opening through which a bolt, for example, can extend for attaching the package 13 to the mounting surface 14 of the motor 11. It is generally positioned just caddy-corner of the front end of the fin 107. As explained above, the "comma-shaped" fin 110 extends outwardly from the cylindrical housing of the boss member 131.

One may now appreciate that the present invention provides the integrated dynamoelectric machine diagnostic system 10 wherein the package 13 allows the permanent mounting of the diagnostic module 12 to the machine 11. Although the invention has been and described with respect to a certain preferred embodiment, it is obvious that equivalent alterations and modifications will occur to others skilled in the art upon a reading and understanding of this specification. The present invention includes all such equivalent alterations and modifications and is limited only by the scope of the following claims.

What is claimed is:

1. In combination, a dynamoelectric machine and a machine diagnostic system for on-line diagnosis of the machine;

the machine diagnostic system comprising a machine diagnostic module which collects data relating to operation of the machine and a package which is permanently mounted to an outer mounting surface of the machine, so that the machine diagnostic module recovers data from a same precise location on the outer mounting surface and comparison reliability of data collected at appropriate times is substantially increased; and the package comprising a container which contains the machine diagnostic module and a heat dissipation device, positioned between the container and the outer mounting surface of the machine, which dissipates heat generated by the machine into surrounding air thereby minimizing heat transfer to the container.

2. The combination set forth in claim 1, the heat dissipation device includes a first set of fins which transfer the heat by convection into the surrounding air.

3. The combination set forth in claim 2, each of the fins in the first set of fins has a base which engages the outer mounting surface of the machine and a tip which engages the container whereby heat is conducted through the base towards the tip and is transferred by convection into the surrounding air.

4. The combination set forth in claim 3, the heat dissipation device includes a front edge and a rear edge and wherein the first set of fins include at least some fins which extend between the front edge and the rear edge.

5. The combination set forth in claim 4, at least some of the fins in the first set of fins extend only partially between the front edge and the rear edge.

6. The combination set forth in claim 4 at least some of the fins in the first set of fins extend in a generally straight path.

7. The combination set forth in claim 4, at least one of the fins in the first set of fins extends in a curved path.

8. The combination set forth in claim 4, at least some of the fins in the first set of fins are of different widths.

9. The combination set forth in claim 2, the first set of fins are attached to the container.

10. The combination set forth in claim 9, the fins are integral with the container.

11. The combination set forth in claim 10, the fins are formed in one piece with the container.

12. The combination set forth in claim 11, the container and the heat dissipation device are made of at least one of, cast iron, dicast aluminum, extruded aluminum, machined aluminum, and thermally conductive plastic.

13. The combination set forth in claim 2, said container is formed by a series of walls and the fins project outwardly from one of the walls.

14. The combination set forth in claim 13, the fins in the first set of fins project perpendicularly from the one of the series of walls.

15. The combination set forth in claim 14, the series of walls include a bottom wall and set of side walls extending upwardly from the side walls to form a box-like structure and wherein the first set of fins extend perpendicularly downward from the bottom wall.

16. The combination set forth in claim 15, the machine mounting surface is flat and wherein the tip-to-base dimension of each of the fins in the first set of fins is substantially the same.

17. The combination set forth in claim 15, the machine mounting surface is curved and wherein the tip-to-base dimension of the first set of fins varies to form a contour corresponding to the curved machine mounting surface.

18. The combination set forth in claim 2, the machine is an electric motor including a rotor.

19. The combination set forth in claim 2, the machine comprises a fan generating an exhaust airflow and wherein the exhaust airflow is directed towards the first set of fins so that the exhaust air may travel between at least some of the fins thereby continuously conveying the surrounding air away from the container.

20. The combination set forth in claim 19, the package further comprises a second set of fins having their bases attached to the container and their tips positioned in the passageway through which the airflow passes.

21. The combination set forth in claim 19, the machine further comprises a shroud which directs the airflow towards the heat dissipation device.

22. The combination set forth in claim 21, the first set of fins define a plurality of regions and wherein the shroud includes a baffle which divides the airflow into a plurality of component airflow and which directs the component airflow towards the respective regions defined by the first set of fins.

23. A package for a diagnostic module of a dynamoelectric machine comprising:
   a container to contain the diagnostic module; and a heat dissipation device which includes a first set of fins, at least one of the fins having a base which engages an outer mounting surface of the machine and a tip which engages the container whereby heat is conducted through the base towards the tip and is transferred by convection into the surrounding air; and
   means for substantially increasing comparison reliability of collected data.

24. The combination set forth in claim 1 further comprising:
   a network backbone connected to the machine diagnostic module; and
   a host computer connected to the network backbone able to receive diagnostic data provided from the machine diagnostic module and to allow on-line diagnosis of the machine.

* * * * *